(12) United States Patent
Gopalakrishnan et al.

(10) Patent No.: US 9,305,650 B2
(45) Date of Patent: Apr. 5, 2016

(54) JUNCTION FIELD-EFFECT FLOATING GATE MEMORY SWITCH WITH THIN TUNNEL INSULATOR

(71) Applicant: International Business Machines Corporation, Armonk, NY (US)

(72) Inventors: Kailash Gopalakrishnan, San Jose, CA (US); Bahman Hekmatshoartabari, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 84 days.

(21) Appl. No.: 14/181,427

(22) Filed: Feb. 14, 2014

(65) Prior Publication Data

US 2015/0236027 A1   Aug. 20, 2015

(51) Int. Cl.
| | | |
|---|---|---|
| G11C 11/34 | (2006.01) |
| G11C 16/10 | (2006.01) |
| H01L 29/78 | (2006.01) |
| H01L 27/12 | (2006.01) |
| H01L 29/66 | (2006.01) |
| H01L 21/28 | (2006.01) |
| H01L 29/423 | (2006.01) |
| H01L 29/788 | (2006.01) |
| G11C 16/04 | (2006.01) |

(52) U.S. Cl.
CPC .......... *G11C 16/10* (2013.01); *H01L 21/28273* (2013.01); *H01L 27/1203* (2013.01); *H01L 29/42324* (2013.01); *H01L 29/66825* (2013.01); *H01L 29/7841* (2013.01); *H01L 29/7885* (2013.01); *G11C 16/0416* (2013.01)

(58) Field of Classification Search
CPC ....... G11C 16/10; G11C 16/12; H01L 27/115
USPC .............. 365/185.28, 185.19, 185.29, 185.18
See application file for complete search history.

(56) References Cited

U.S. PATENT DOCUMENTS

| | | |
|---|---|---|
| 5,751,631 A | 5/1998 | Liu |
| 5,814,854 A | 9/1998 | Liu |
| 6,864,139 B2 | 3/2005 | Forbes |
| 6,881,624 B2 | 4/2005 | Forbes |
| 6,888,749 B2 | 5/2005 | Forbes |
| 7,209,390 B2 * | 4/2007 | Lue et al. ............... 365/185.19 |
| 7,479,428 B2 * | 1/2009 | Forbes ...................... 438/261 |
| 7,750,417 B2 * | 7/2010 | Iino et al. .................. 257/392 |
| 7,955,960 B2 | 6/2011 | Kim |
| 8,288,264 B2 | 10/2012 | Bhattacharyya |

* cited by examiner

*Primary Examiner* — Son Dinh
(74) *Attorney, Agent, or Firm* — Louis J. Percello; Otterstedt, Ellenbogen & Kammer, LLP

(57) ABSTRACT

A dense binary memory switch device combines the function of a pass transistor and a memory cell and has low programming and operation voltages. The device includes a charge storage region coupled to a gate electrode through a gate dielectric layer and to a channel region through a tunneling dielectric layer. The charge storage region includes a floating gate charged by tunneled carriers from the channel region. Charge retention is facilitated by the band offset between the charge storage region and the tunneling dielectric layer.

21 Claims, 5 Drawing Sheets

JUNCTION FIELD-EFFECT FLOATING GATE MEMORY SWITCH WITH THIN TUNNEL INSULATOR

FIELD

The present disclosure relates to the physical sciences and, more particularly, to memory switch devices, uses of such devices, and methods of fabrication thereof.

BACKGROUND

Field programmable gate arrays (FPGAs) are integrated circuits generally characterized by configurable logic blocks with programmable interconnects. FPGAs are designed to be reprogrammed subsequent to manufacture. A combination of a pass transistor and a memory cell such as static random access memory (SRAM) is conventionally used as a binary memory wiring switch in FPGAs. The area taken by the pass transistor and the SRAM cell (comprised of several transistors) is a large fraction of the total area inside a FPGA.

FIG. 1 illustrates a conventional floating gate memory device 20 including a "normally off" transistor structure. The device includes an electrically insulating layer 22 such as a buried oxide (BOX) layer. Silicon dioxide is among the materials from which the insulating layer may be formed. A semiconductor layer 24 including highly doped source and drain regions 26 and a channel region 28 adjoin the electrically insulating layer 22. The source and drain regions 26 have the same conductivity type (n+) while the channel region is p−. A drain electrode 30 is formed directly on one of the regions 26 and a source electrode 32 is formed directly on the other of the regions 26. A tunneling dielectric layer 34 adjoins the channel region 28 and a floating gate 36, for example a p+ polysilicon layer. A second (gate) dielectric layer 42 such as a high-k dielectric layer adjoins the floating gate. A gate 44 adjoins the second dielectric layer and is functional as a control gate. The transistor structure turns on if the read voltage on the gate 44 is higher than the programmed threshold voltage of the device. A positive gate bias is applied to perform a write function. An electron channel is formed in the p− channel region 28 close to the interface with the tunneling dielectric layer 34. The floating gate 36 is negatively charged by tunneling of channel electrons into the floating gate. In NAND flash applications, hot electrons, energized by the lateral electric field, tunnel into the floating gate. In NOR flash applications, electron tunneling is via the Fowler-Nordheim (direct tunneling) mechanism. Program voltages are relatively high (typically>10V) due to thick tunnel dielectric (typically>10 nm) required for sufficient retention. A positive gate bias is required to perform a read function. The negative charge retained in the floating gate 36 results in a net positive threshold voltage shift. The transistor does not turn on if the read voltage on the gate is lower than the new threshold voltage. A negative gate bias is provided to implement an erase function. The electrons tunnel out of the floating gate 36 into the n+ regions 26. The erase voltages are also relatively high (typically<−10V) due to the thick tunneling dielectric layer 34.

SUMMARY

Principles of the present disclosure provide a field-effect floating gate memory device including a channel region having a conductivity type and adjoining an electrically insulating substrate, doped source and drain regions operatively associated with and having the same conductivity type as the channel region, and a control gate. A floating gate for storing carriers from the channel region is positioned between the channel region and the control gate. The floating gate has a doping type opposite to the conductivity type of the channel region. A first, high-k dielectric layer thinner than five nanometers between the channel region and the floating gate is positioned to facilitate direct tunneling of majority carriers from the channel region into the floating gate. The first dielectric layer provides a lower barrier for quantum tunneling of the majority carriers from the channel region into the floating gate than that for the minority carriers.

A method in accordance with the principles described herein includes providing a field-effect floating gate memory device including a channel region having a conductivity type and adjoining an electrically insulating substrate, doped source and drain regions operatively associated with and having the same conductivity type as the channel region, a control gate, a floating gate for storing charge carriers from the channel region, the floating gate being positioned between the channel region and the control gate, the floating gate having a doping type opposite to the conductivity type of the channel region, and a first, high-k dielectric layer thinner than five nanometers between the channel region and the floating gate and positioned to facilitate direct tunneling from the channel region into the floating gate. A gate bias is applied, causing charge carriers to tunnel into the floating gate from the channel region. The charge carriers are stored in the floating gate.

A further exemplary method includes obtaining a structure including a semiconductor layer on an electrically insulating substrate and forming a channel region and source/drain regions having the same conductivity type from the semiconductor layer. A high-k tunneling dielectric layer is formed on the semiconductor layer, the tunneling dielectric layer overlapping the channel region. The tunneling dielectric layer provides a lower barrier for the tunneling of majority carriers from the channel region into the floating gate than that for the tunneling of minority carriers from the channel region into the floating gate. The method further includes forming a floating gate on the tunneling dielectric layer having a conductivity type opposite from the conductivity type of the channel region, forming a gate dielectric layer on the floating gate, and forming a gate electrode on the gate dielectric layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Junction field-effect floating gate structures and fabrication methods as disclosed herein can provide substantial beneficial technical effects. For example, one or more embodiments may provide one or more of the following advantages:

Combined function of pass transistor and memory cell with relatively low programming and operation voltages;
Choice of device architectures;
Applicability to field-programmable gate arrays;
Spatial efficiency;

These and other features and advantages will become apparent from the following detailed description of illustrative embodiments thereof, which is to be read in connection with the accompanying drawings.

DETAILED DESCRIPTION

A dense binary memory switch which combines the function of a pass transistor and a memory cell with low programming and operation voltages is disclosed in accordance with exemplary embodiments as discussed below. The disclosed devices include channel regions similar to those found in junction field-effect transistors. They further include a floating gate region for charge storage that is coupled to a control gate electrode through a gate dielectric layer and coupled to the channel region through a tunneling dielectric layer. The tunneling dielectric layer is sufficiently thin to allow programming the floating gate by direct tunneling at low voltages. In order to facilitate programming while improving retention, the tunneling dielectric has at least one and preferably both of the following features: (i) provides a smaller band-offset for the carrier type involved in programming (i.e. majority carriers in the channel) compared to that for the opposite carrier type (i.e. minority carriers in the channel), (ii) provides a lower effective mass for the carrier type involved in programming (i.e. majority carriers in the channel) compared to that for the opposite carrier type (i.e. minority carriers in the channel). For example, if electrons are the carriers trapped in the floating gate, the tunneling insulator has (i) a lower conduction band-offset than the valence band-offset with the semiconductor material forming the channel layer, and/or (ii) a lower effective mass for electrons than that for holes. Methods for fabricating such memory switches at low temperatures compatible with back-end-of-the-line (BEOL) processing are further disclosed.

Figure 1:
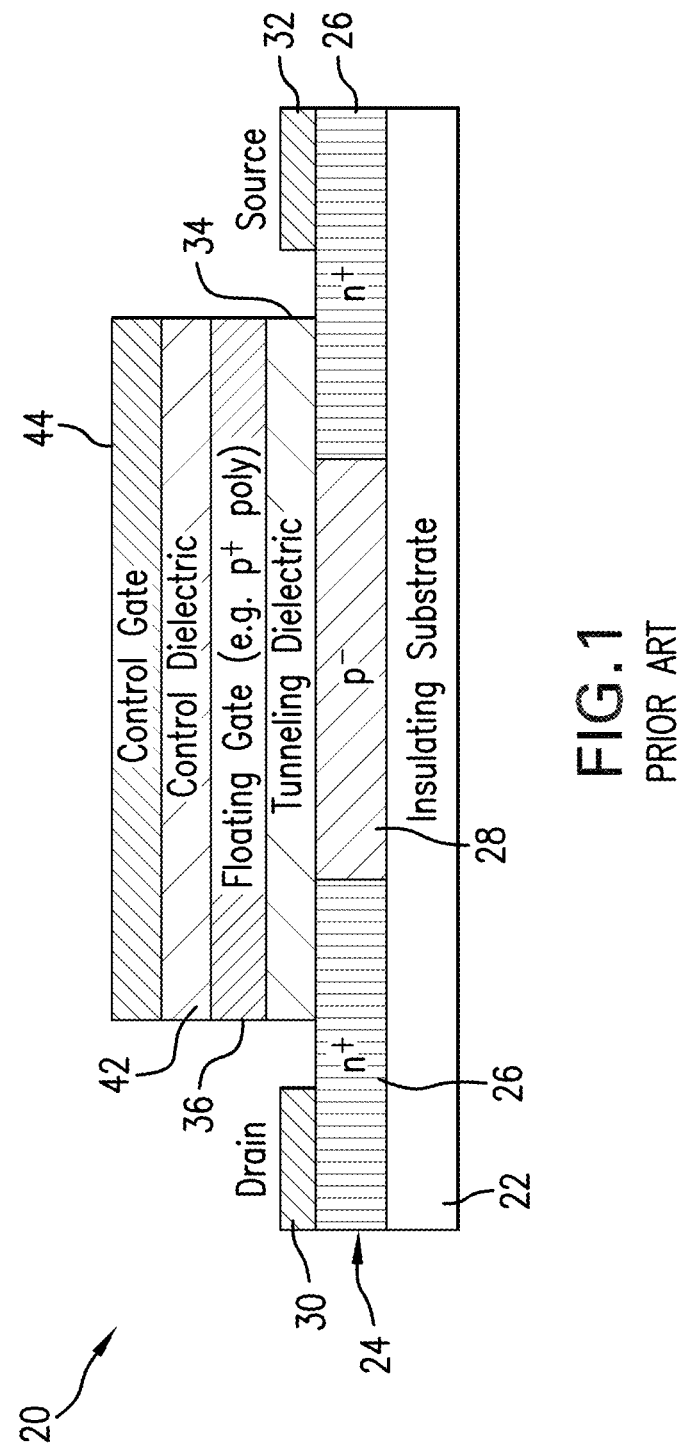
FIG. 1 is a schematic sectional view of a prior art floating gate memory switch.
Figure 2:
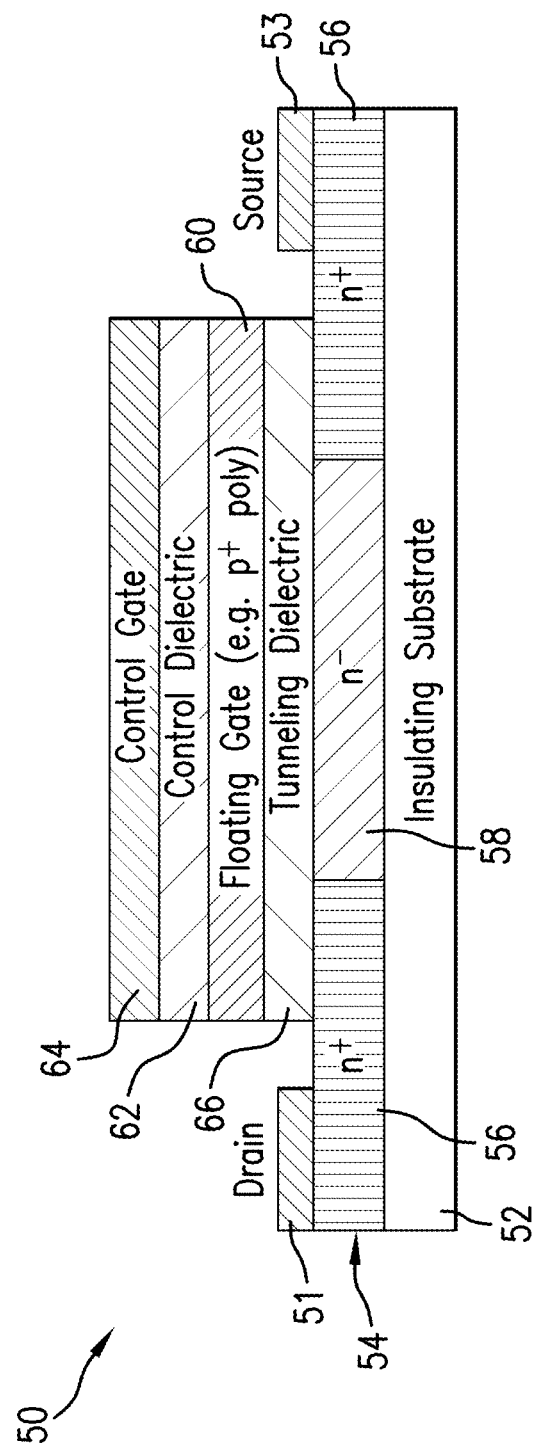
FIG. 2 is a schematic sectional view of an exemplary floating gate memory switch.

An exemplary device 50 designed to function as a "normally on" transistor structure is shown in FIG. 2. The device includes an electrically insulating layer 52 such as a buried oxide (BOX) layer. Silicon dioxide is among the materials from which the insulating layer may be formed. A semiconductor layer 54 including highly doped source and drain regions 56 and a channel region 58 adjoin the electrically insulating layer 52. The source and drain regions have the same conductivity type as the substrate semiconductor layer 54. In one or more exemplary embodiments, the source and drain regions 56 are n+ (highly doped) and the channel region 58 is n− (lesser doping concentration). In embodiments employing silicon-based channel regions, n-type doping is preferable to p-type doping due to higher electron mobility than hole mobility in silicon. Low "on" resistance is thereby obtained. In an exemplary embodiment including n-type silicon channel material, a hafnium oxide tunneling dielectric layer having a thickness between 0.5-2.0 nm is employed. A drain electrode 51 is formed directly on one of the regions 56 and a source electrode 53 is formed directly on the other of the regions 56. The semiconductor layer 54 is formed from laser-crystallized polysilicon in some exemplary embodiments.

A floating gate 60 is coupled to the channel region 58 through a tunneling dielectric layer 66. The floating gate is a highly doped p+ polysilicon layer in some embodiments. Other highly doped semiconductor materials may alternatively be employed to form the floating gate. Poly-Ge, poly-SiGe, and metal oxides are among the materials employed in one or more alternative embodiments. The floating gate 60 has a doping type opposite to that of the channel region 58 in one or more exemplary embodiments, including the exemplary embodiment of FIG. 2. In preferred embodiments, the tunneling dielectric layer 66 is a high-k dielectric layer such as hafnium oxide to reduce the programming voltage of the device 50. (A high-k dielectric material is understood as having a high dielectric constant as compared to silicon dioxide.) The tunneling dielectric layer preferably has a lower tunneling barrier for the carrier type, for example electrons, involved in programming the floating gate 60 as compared to the other carrier type, for example holes. As known in the art, a lower tunneling barrier refers to a smaller band-offset and/or smaller effective mass for the respective carrier type. For example, if the channel region is comprised of an n-type semiconductor (i.e. electrons are the majority carriers while holes are the minority carriers), the conduction band-offset between the first (tunneling) dielectric layer and the semiconductor channel is smaller than the valence band-offset between the first dielectric layer and the semiconductor channel and/or the effective tunneling mass of electrons in the first dielectric layer is smaller than the effective tunneling mass of holes in the first dielectric layer. In embodiments employing silicon-based channel regions, n-type doping is preferable to p− type doping for two reasons: (i) since electron mobility is higher than hole mobility in silicon, a lower "on" resistance is obtained with n-type doping, (ii) the vast majority of high-k dielectrics provide a lower effective mass for electrons compared to holes, as well as a lower conduction band offset with silicon compared to the valence band-offset with silicon. Examples of such high-k dielectrics include but are not limited to $HfO_2$, $Al_2O_3$, $SrTiO_3$, $PbTiO_3$, $TiO_2$, $BaZrO_3$, $PbZrO_3$, $Ta_2O_5$, $SrBi_2Ta_2O_9$, $ZrO_2$, $ZrSiO_4$, $HfSiO_4$. The thickness of the tunneling dielectric layer is thinner than five nanometers (5 nm) in one or more embodiments. In order to maintain an even higher electric field for direct carrier tunneling, a tunneling dielectric layer thinner than three nanometers (3 nm) is employed in some embodiments. A gate dielectric layer 62 such as a high-k dielectric layer adjoins the opposite side of the floating gate 60. A gate electrode 64 adjoins the gate dielectric layer and is functional as a control gate, as described further below. The floating gate 60 is coupled to the control gate electrode 64 through the gate dielectric layer 62.

Prior to programming, the exemplary device 50 is normally on. No gate bias is required for performing a read function; however a designated gate voltage may be used if desired. A normally-on device refers to preferably no depletion or alternatively only a partial depletion of the channel. In one example where the channel in n-type and there is no fixed charge or interfacial charge associated with the dielectric layers and no pre-existing trapped charge in the floating gate, the workfunction difference between the control gate and the n-type channel may be expressed as $\Delta\phi = \Phi_G - \Phi_S$, where $\Phi_G$ is the workfunction of the gate electrode and $\Phi_S$ is the workfunction of the channel n-type semiconductor material, which may be expressed as $\Phi_S = E_i + \chi_e - (kT/q)\cdot\ln(N_D/n_i)$, where $E_i$ is the intrinsic Fermi level with respect to the conduction band edge, $\chi_e$ is the electron affinity, k is the Boltzmann constant, T is the absolute temperature, q is the electron charge, $N_D$ the concentration of donors and $n_i$ is the intrinsic carrier concentration. ($E_i=E_g/2-(kT/q)\cdot\ln(N_V/N_C)$, where $E_g$ is the bandgap (~1.1 eV in silicon), $N_V$ the effective density of states in the valence band, and $N_C$ the effective density of states in the conduction band. In silicon, $N_C \approx N_V$ and therefore Ei≈Eg/2). $E_i$ and $\chi_e$ (~4.05 eV in silicon) are independent of doping concentration $N_D$. If $\Delta\phi<0$, the channel is not depleted. If $\Delta\phi>0$, the channel may be either fully or partially depleted. The width of the depletion region $W_D$ may be calculated from the equation $q\cdot N_D\cdot W_D=\Delta\phi\cdot(1/C_i+W_D/\in_S)^{-1}$, where $\in_S$ is the dielectric constant for the channel semiconductor material and $C_i=C_C\cdot C_T/(C_C+C_T)$, where $C_C$ and $C_T$ are dielectric capacitance per unit area of the control insulator and the tunneling insulator respectively, and may be expressed as $C_C=\in_C/t_C$, $C_T=\in_T/t_T$, where $\in_C$ is the dielectric constant of the control insulator, $\in_T$ is dielectric constant of the tunneling insulator, $t_C$ is the thickness of the control insulator, and $t_T$ is the thickness of the tunneling insulator. If the $W_D$ calculated from the above equation is smaller than the thickness of the channel semiconductor $t_S$, the device is partially depleted, and if it is equal or greater than $t_S$, the device is fully depleted. Therefore, in an appropriate design, $\Delta\phi<0$ (accumulated channel), $\Delta\phi=0$ (flat band conditions); or $\Delta\phi>0$ and $W_D<t_S$. (partially depleted channel). A positive gate bias is applied to perform a write function. Upon application of a positive bias to the gate electrode 64 of the exemplary device 50, electrons tunnel into the floating gate 60 from the n+ and n− regions of the semiconductor layer 54 by direct tunneling. The write function is facilitated by the relatively low tunneling barrier for electrons. The electrons that have tunneled into the floating gate 60 are recombined with the majority holes in the floating gate 60, the floating gate 60 is negatively charged and the device turns off. In order for the device to fully turn off, the total trapped charge in the floating gate, $Q_T$ (note $Q_T<0$ because electrons are negatively charged, $Q_T=-q\cdot N_T$, where $N_T$ is the total number of trapped electrons) must be sufficient to ensure the channel is depleted, i.e. $\Delta\phi-Q_T/C_C>0$ or $E_i+\chi_e-(kT/q)\cdot\ln(N_D/n_i)-Q_T/C_C>0$, and furthermore ensure the channel is fully depleted, i.e. in the equation $q\cdot N_D\cdot W_D=(E_i+\chi_e-(kT/q)\cdot\ln(N_D/n_i)-Q_T/C_C)\cdot(1/C_i+W_D/\in_S)^{-1}$, the calculated depletion region width $W_D$ must be larger than the thickness of the channel layer, $t_S$. Therefore, in order to fully deplete the channel, the total trapped charge must satisfy the condition $Q_T<(kT/q)\cdot\ln(N_D/n_i)-E_i-\chi_e-q\cdot N_D\cdot t_S\cdot(1/C_i+t_S/\in_S)$. After the "write" function is performed, the floating gate 60 retains the negative charge, the n− region 58 is fully depleted, and the transistor remains off. Retention of negative charge in the floating gate is facilitated by (i) the p+ doping of the floating gate assuring a very small number of minority electrons existing in the floating gate to tunnel out of the floating gate, and (ii) the relatively large barrier for tunneling of minority holes from the channel into the floating gate. A negative gate bias is employed for performing an "erase" function. The erase function involves (i) tunneling of minority holes from the semiconductor layer 54 into the floating gate 60, and (ii) tunneling of the minority electrons out of the floating gate 60 into the semiconductor layer 54. If the device is used as a volatile memory, the erase function may be omitted.

Figure 3A:
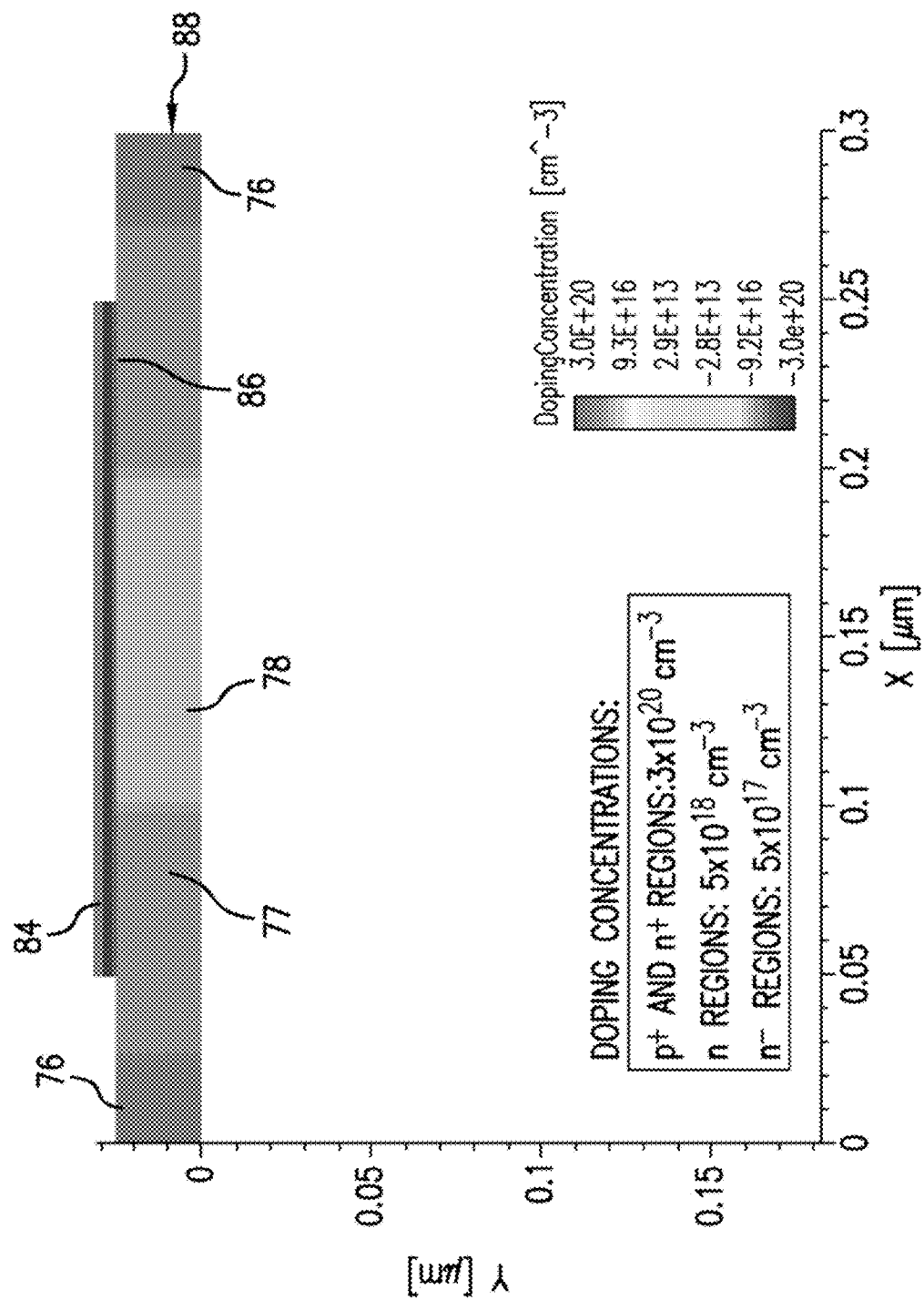
FIG. 3A is a technology computer-aided (TCAD) simulation of portions of an exemplary memory switch showing exemplary acceptor and donor concentrations.
Figure 3B:
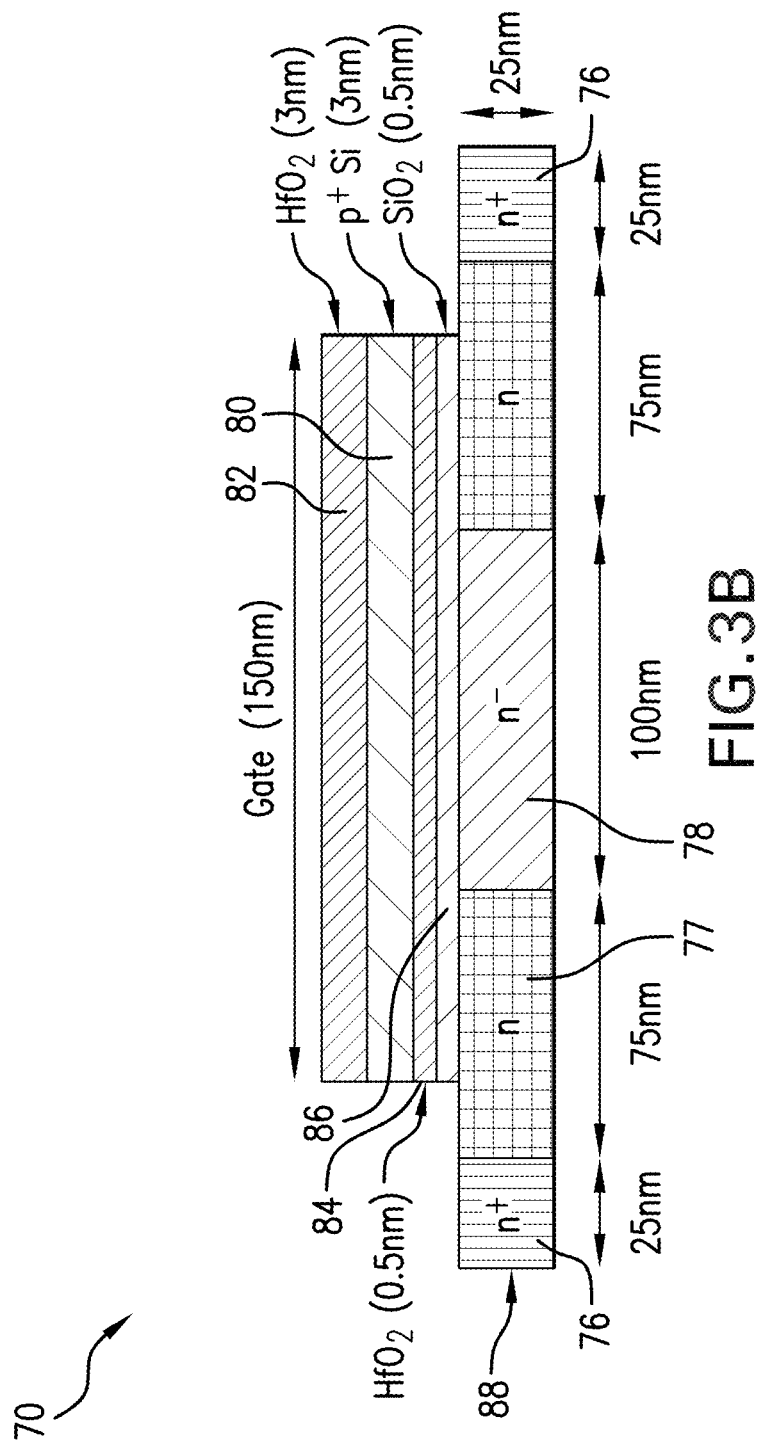
FIG. 3B is a schematic sectional view of an exemplary floating gate memory switch corresponding to that shown in the TCAD simulation in FIG. 3A.

FIGS. 3A and 3B show, respectively, a technology computer-aided design (TCAD) simulation of the semiconductor layer 88 and adjoining tunneling dielectric layer of an exemplary device before programming, including dimensions and acceptor/donor concentrations and a schematic illustration of an exemplary floating gate memory switch 70. The elements shown in the TCAD simulation correspond to those in the exemplary device 70. (The insulating substrate and gate electrode are omitted from the schematic illustration.)

The n− channel region 78 of the device 70 has a doping concentration of $5\times10^{17}$ cm$^{-3}$ while the adjoining n+ regions 76 each have much higher doping concentrations of $3\times10^{20}$ cm$^{-3}$. The floating gate 80 has a doping concentration of $3\times10^{20}$ cm$^{-3}$. The n regions 77 adjoining the channel region 78 have doping concentrations of $5\times10^{18}$ cm$^{-3}$. Each n+ and adjoining n region 76, 78 comprises a source or drain region. In some other embodiments, the regions 77 and 78 have the same n− doping concentration, i.e. hence a uniformly-doped channel; in some further embodiments, the n-doped regions 77 have the same n+ doping concentration as the source/drain regions 76, i.e. source/drain regions overlap with the gate stack. In some embodiments, an overlapped structure reduces the retention time (this is because the tunneling of carriers between the floating gate and the channel may be easier at parts of the channel that have higher doping), while lowering the on-resistance, and an underlapped structure increases the retention time, while increasing the on-resistance. Because of this trade-off between retention time and on-resistance, in some embodiments, providing three different n-type doping levels as shown in the example of FIGS. 3A and 3B, may provide an optimum between retention time and on-resistance. The hafnium oxide gate dielectric layer 82 has a thickness of three nanometers in this exemplary embodiment. The hafnium oxide tunneling dielectric layer 84 has a thickness of 0.5 nanometers. A silicon dioxide layer 86 having a thickness of 0.5 nanometers is between the semiconductor layer 88 and the tunneling dielectric layer. As known in the art, at typical growth conditions used for atomic layer deposition of HfO$_2$ on silicon, a thin SiO$_2$ layer automatically forms between HfO$_2$ and silicon. The TCAD simulation provided in FIG. 3A is intended to represent the presence of such an exemplary SiO$_2$ interfacial layer. As known in the art, the thin SiO$_2$ interfacial layer however may be "scavenged" by post-growth processes such as thermal annealing. Such post-growth processes may not be suitable for BEOL processing. The silicon dioxide layer 86 directly contacts the channel region 78 and adjoining n regions 77 in the exemplary embodiment. The doping concentrations and dimensions indicated in FIGS. 3A and 3B should be considered exemplary. The gate electrode and underlying gate dielectric, floating gate, and tunneling dielectric layers have widths of 150 nm. The semiconductor layer 74 has a width of three hundred nanometers (300 nm). Each n+ region 76 has a width of twenty-five nanometers (25 nm). The n− channel region 78 has a width of one hundred nanometers and the adjoining n regions 77 are each seventy-five nanometers wide. The thickness of the semiconductor layer 74 in the exemplary embodiment is twenty-five nanometers (25 nm). The channel region 78, the n+ source/drain regions 76 and the floating gate 80 are comprised of silicon in one or more exemplary embodiments. Silicon may be doped with materials such as phosphorus to obtain an electrically conductive n-type semiconductor. Dopants such as boron may be employed to obtain p-type semiconductors.

Figure 6:
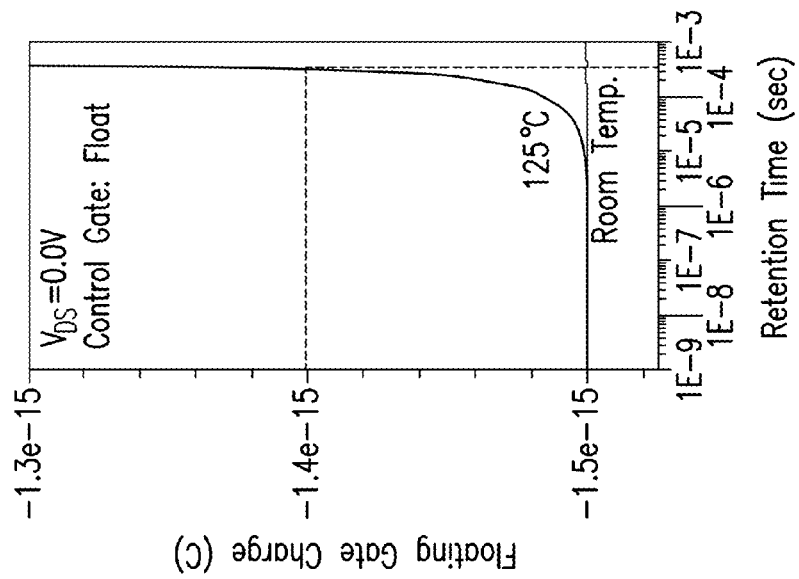
FIG. 6 is a graph showing floating gate charge (C) of an exemplary memory switch as a function of retention time.
Figure 5:
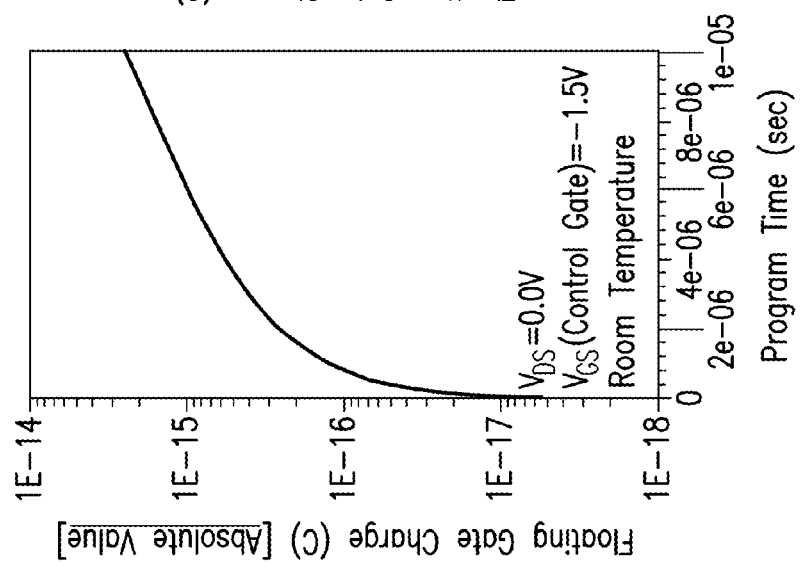
FIG. 5 is a graph showing drain current as a function of floating gate total charge (C) of an exemplary memory switch.
Figure 4:
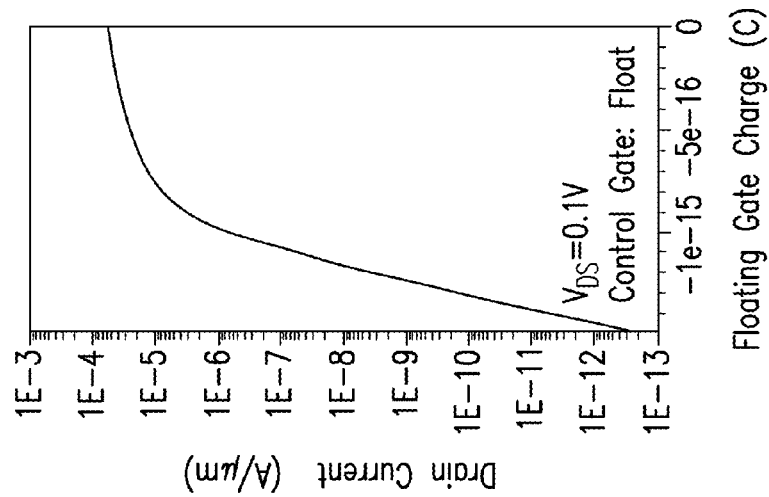
FIG. 4 is a graph showing drain current as a function of floating gate charge of an exemplary memory switch.

FIG. 4 is a graph showing drain current as a function of floating gate charge for an exemplary embodiment as described above with respect to FIGS. 3A and 3B wherein the control gate is at float and the drain-source voltage ($V_{DS}$) is 0.1V. FIG. 5 shows the floating gate charge as a function of program time where the drain-source voltage ($V_{DS}$) is 0.0V and the control gate voltage $V_{GS}$ is 1.5V. The program time for an exemplary device is less than ten microseconds (10 μs). FIG. 6 is a graph showing floating gate charge as a function of retention time at room-temperature (25° C.) and a temperature of 125° C. wherein the control gate is at float and the drain-source voltage ($V_{DS}$) is 0.0V. As observed in FIG. 6, a ten percent (10%) loss of stored charge (from $-1.5\times10^{-15}$ C to $-1.4\times10^{-15}$ C) takes place in about 350 µs. As observed in FIG. 4, a 10% loss of charge from $-1.5\times10^{-15}$ C to $-1.4\times10^{-15}$ C results in about ~10× (tenfold) increase in the drain current (which is in the OFF-state). Therefore, in order to assure a tolerance of 10% in OFF current at 125° C. (i.e. less than 10% increase of OFF-current due to the loss of charge from the floating gate), a refresh time of 350 µs or shorter must be used, i.e. the control gate must be re-programmed every 350 µs or shorter time period. If a larger current variation can be tolerated (depending on the application) or operation temperatures are lower, longer refresh times can be used.

Fabrication of the structures described above can be conducted using techniques familiar to those of skill in the art. The doped source and drain regions 56 and the channel region 58 are formed using, for example, ion implantation of a semiconductor-on-insulator substrate in some embodiments. In an exemplary embodiment, the semiconductor layer 54 is laser-crystallized polysilicon. The dielectric layers 62, 66 can be formed using any known technique including but not limited to thermal oxidation, deposition by thermal or e-beam evaporation, sputtering, atomic-layer deposition (ALD) or various chemical vapor deposition (CVD) methods known in the art. The deposition of a doped polysilicon floating gate layer is conducted by pyrolyzing silane in one or more embodiments, the dopants being added during deposition.

Given the discussion thus far and with reference to the exemplary embodiments discussed above and the drawings, it will be appreciated that, in general terms, an exemplary field-effect floating gate memory device includes a channel region having a conductivity type and adjoining an electrically insulating substrate. An exemplary device 50 having an n− channel region 58 is shown in FIG. 2. FIG. 3B shows another exemplary device 70 having an n-channel region 78 with doping concentration of $5\times10^{17}$ cm$^{-3}$. Doped source and drain regions are operatively associated with and have the same conductivity type as the channel region. The device further includes a control gate, a floating gate for storing carriers from the channel region, the floating gate (60 in FIG. 2, 80 in FIG. 3B) being positioned between the channel region and the control gate. The floating gate has a doping type opposite to the conductivity type of the channel region. In the exemplary embodiments shown in FIGS. 2 and 3A-B, the channel regions are n− while the floating gates are p+. (Exemplary doping levels are provided in FIG. 3A.) A first, high-k dielectric layer (66 in FIG. 2, 84 in FIG. 3A) thinner than five nanometers is between the channel region and the floating gate and is positioned to facilitate direct tunneling of majority carriers from the channel region into the floating gate. The first, high-k dielectric layer is configured to provide a lower barrier for the tunneling of majority carriers from the channel region into the floating gate compared to that for minority carriers in the channel region. A second dielectric layer (62 in FIG. 2, 82 in FIG. 3A) is between the control gate and the floating gate. The first (tunneling) dielectric layer has a lower conduction band-offset with the channel region 58 than its valence band-offset with the channel region in one or more embodiments. The first dielectric layer further has a smaller effective mass for electrons than holes in some embodiments. In some embodiments, tunneling of carriers between the floating gate and channel is facilitated by the source and drain regions and/or other semiconductor regions having higher doping concentrations than the channel region. The first (tunneling) dielectric layer overlaps the regions having relatively high doping concentrations in such embodiments. The channel region 58, 78 is comprised of silicon in some embodiments, and further includes an interfacial silicon dioxide layer 86 between the channel region and the first (tunneling) dielectric layer. FIGS. 3A and 3B illustrate an exemplary device 70 having an interfacial silicon dioxide layer 86. In some embodiments, the field-effect floating gate memory device further includes a silicon semiconductor layer 88 between the first dielectric layer and the electrically insulating substrate, the silicon semiconductor layer comprising the channel region 78 and the doped source and drain regions 76, the semiconductor layer further including first and second doped regions 77 positioned respectively between the channel region 78 and the doped source and drain regions. The first and second doped regions 77, the channel region 78 and the doped source and drain regions 78 having n-type doping levels, the n-type doping level of the first and second doped regions 77 being greater than the n-type doping level of the channel region 78 and less than the n-type doping level of the doped source and drain regions 76, the first dielectric layer 84 overlapping the first and second doped regions 77. FIG. 3A shows a semiconductor layer 88 having such regions and provides exemplary doping levels.

An exemplary method includes providing a field-effect floating gate memory device including a channel region having a conductivity type and adjoining an electrically insulating substrate, doped source and drain regions operatively associated with and having the same conductivity type as the channel region, a control gate, a floating gate for storing charge carriers from the channel region and doped source and drain regions, the floating gate being positioned between the channel region and the control gate, the floating gate having a doping type opposite to the conductivity type of the channel region, a first, high-k dielectric layer thinner than five nanometers between the channel region and the floating gate and positioned to facilitate direct tunneling of majority charge carriers from the channel region into the floating gate, and applying a gate bias, thereby causing charge carriers (e.g. electrons) to tunnel into the floating gate from the channel region. The first, high-k dielectric layer provides a lower barrier for the tunneling of majority carriers from the channel region into the floating gate compared to that of minority carriers in the channel region. As discussed above, the exemplary device 50 functions in accordance with the exemplary method for performing a write function. The floating gate retains the charge. The exemplary method may further include the step of applying a negative gate bias, thereby causing the minority charge carriers existing in the floating gate (electrons in an exemplary embodiment) to tunnel into the channel region and the minority carriers existing in the channel region (holes in an exemplary embodiment) to tunnel into the floating gate. An erase function may be performed using such a step. In some embodiments, tunneling of carriers to and from regions in addition to the channel region, such as the source and drain regions, may occur.

An exemplary fabrication method includes obtaining a structure including a semiconductor layer on an electrically insulating substrate and forming a channel region and source/drain regions having the same conductivity type as the semiconductor layer. A high-k tunneling dielectric layer is formed on the semiconductor layer, the tunneling dielectric layer overlapping the channel region. The tunneling dielectric provides at least one of a smaller band-offset with the channel region for majority carriers in the channel region than that for minority carriers and a lower effective tunneling mass for majority carriers in the channel region than that for minority carriers. In some embodiments, the high-k tunneling dielectric layer has a lower conduction band-offset with the channel region than its valence band-offset with the channel region.

The method further includes forming a floating gate having a conductivity type opposite from the conductivity type of the channel region on the tunneling dielectric layer, forming a gate dielectric layer on the floating gate, and forming a gate on the gate dielectric layer. An exemplary structure 50 as described above with respect to FIG. 2 can thereby be obtained. In some exemplary embodiments, the conductivity type of the channel region is n-type.

Those skilled in the art will appreciate that the exemplary structures discussed above can be distributed in raw form or incorporated as parts of intermediate products or end products that benefit from having synaptic devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A field-effect floating gate memory device comprising:
   a channel region having a conductivity type and adjoining an electrically insulating substrate;
   doped source and drain regions operatively associated with and having the same conductivity type as the channel region;
   a control gate;
   a floating gate for storing carriers from the channel region, the floating gate being positioned between the channel region and the control gate, the floating gate having a doping type opposite to the conductivity type of the channel region;
   a first, high-k dielectric layer thinner than five nanometers between the channel region and the floating gate and positioned to facilitate the direct tunneling of majority carriers from the channel region into the floating gate, the first, high-k dielectric layer being configured to provide a lower barrier for the tunneling of majority carriers from the channel region into the floating gate compared to that for minority carriers in the channel region, and
   a second dielectric layer between the control gate and the floating gate,
   wherein the channel region is comprised of n-type silicon, the first, high-k dielectric layer having at least one of a lower conduction band-offset with the channel region than its valence band-offset with the channel region and a lower effective mass for electrons than holes.

2. The field-effect floating gate memory device of claim 1, wherein the first dielectric layer has a thickness of less than three nanometers.

3. The field-effect floating gate memory device of claim 2, wherein the electrically insulating substrate is a buried oxide layer.

4. The field-effect floating gate memory device of claim 2, further including a semiconductor layer between the first dielectric layer and the electrically insulating substrate and comprising the channel region and the doped source and drain regions, the first dielectric layer overlapping the channel region and doped source and drain regions.

5. The field-effect floating gate memory device of claim 4 wherein the floating gate includes a doped p-type polysilicon layer.

6. The field-effect floating gate memory device of claim 1, wherein the first dielectric layer overlaps the doped source and drain regions.

7. The field-effect floating gate memory device of claim 1, wherein the channel region is comprised of silicon, further including an interfacial silicon dioxide layer between the channel region and the first dielectric layer.

8. The field-effect floating gate memory device of claim 1, wherein the first dielectric layer includes at least one of $HfO_2$, $Al_2O_3$, $SrTiO_3$, $PbTiO_3$, $TiO_2$, $BaZrO_3$, $PbZrO_3$, $Ta_2O_5$, $SrBi_2Ta_2O_9$, $ZrO_2$, $ZrSiO_4$, and $HfSiO_4$.

9. The field-effect floating gate memory device of claim 1, further including a silicon semiconductor layer between the first dielectric layer and the electrically insulating substrate, the silicon semiconductor layer comprising the channel region and the doped source and drain regions, the semiconductor layer further including first and second doped regions positioned respectively between the channel region and the doped source and drain regions, the first and second doped regions, the channel region and the doped source and drain regions having n-type doping levels, the n-type doping level of the first and second doped regions being greater than the n-type doping level of the channel region and less than the n-type doping level of the doped source and drain regions, the first dielectric layer overlapping the first and second doped regions.

10. The field-effect floating gate memory device of claim 9, further including an interfacial silicon dioxide layer between the channel region and the first dielectric layer.

11. The field-effect floating gate memory device of claim 1, wherein the first dielectric layer has a smaller effective tunneling mass for electrons than for holes.

12. The field-effect floating gate memory device of claim 1, wherein the first dielectric layer has a lower conduction band-offset with the channel region than a valence band-offset with the channel region.

13. A method comprising:
   providing a field-effect floating gate memory device including:
      a channel region having a conductivity type and adjoining an electrically insulating substrate;
      doped source and drain regions operatively associated with and having the same conductivity type as the channel region;
      a control gate;
      a floating gate for storing charge carriers from the channel region, the floating gate being positioned between the channel region and the control gate, the floating gate having a doping type opposite to the conductivity type of the channel region;

a first, high-k dielectric layer thinner than five nanometers between the channel region and the floating gate and positioned to facilitate direct tunneling of majority carriers from the channel region into the floating gate, the first, high-k dielectric layer providing a lower barrier for the tunneling of majority carriers from the channel region into the floating gate compared to that of minority carriers in the channel region, the first, high-k dielectric layer being further configured to at least provide a smaller band-offset for majority carriers in the channel region compared to minority carriers therein of the opposite type or a lower effective mass for the majority carriers in the channel region compared to the minority carriers therein;

applying a gate bias, thereby causing charge carriers to tunnel into the floating gate from the channel region, and storing the charge carriers in the floating gate.

14. The method of claim 13, wherein the channel region is n-type and the first, high-k dielectric layer has a lower effective mass for electrons than for holes, further including applying a negative gate bias, thereby causing electrons to tunnel out of the floating gate and into the channel region and causing holes to tunnel from the channel region into the floating gate.

15. The method of claim 13, wherein the channel region includes n-type silicon and the first, high-k dielectric layer has a lower conduction band-offset than a valence band-offset with the channel region.

16. A method comprising:
obtaining a structure including a semiconductor layer on an electrically insulating substrate;
forming a channel region and doped source/drain regions having the same conductivity type from the semiconductor layer;
forming first and second doped regions from the semiconductor layer positioned respectively between the channel region and the doped source/drain regions, the first and second doped regions, the channel region and the doped source/drain regions having n-type doping levels, the n-type doping level of the first and second doped regions being greater than the n-type doping level of the channel region and less than the n-type doping level of the doped source/drain regions;
forming a high-k tunneling dielectric layer overlapping the first and second doped regions on the semiconductor layer, the tunneling dielectric layer further overlapping the channel region, the tunneling dielectric providing at least one of a smaller band-offset with the channel region for majority carriers in the channel region than that for minority carriers and a lower effective tunneling mass for majority carriers in the channel region than that for minority carriers;
forming a floating gate having p-type conductivity type on the tunneling dielectric layer;
forming a gate dielectric layer on the floating gate, and forming a gate on the gate dielectric layer.

17. The method of claim 16, wherein the semiconductor layer comprises silicon, further including forming the tunneling dielectric layer on the semiconductor layer by atomic layer deposition and forming a silicon dioxide interfacial layer between the semiconductor layer and the tunneling dielectric layer.

18. The method of claim 16, further including forming the high-k tunneling dielectric layer with a thickness of less than three nanometers and in overlapping relation to the doped source/drain regions.

19. A field-effect floating gate memory device comprising:
a channel region having a conductivity type and adjoining an electrically insulating substrate;
doped source and drain regions operatively associated with and having the same conductivity type as the channel region;
a control gate;
a floating gate for storing carriers from the channel region, the floating gate being positioned between the channel region and the control gate, the floating gate having a doping type opposite to the conductivity type of the channel region;
a first, high-k dielectric layer thinner than five nanometers between the channel region and the floating gate and positioned to facilitate the direct tunneling of majority carriers from the channel region into the floating gate, the first, high-k dielectric layer being configured to provide a lower barrier for the tunneling of majority carriers from the channel region into the floating gate compared to that for minority carriers in the channel region;
a second dielectric layer between the control gate and the floating gate, and
a silicon semiconductor layer between the first dielectric layer and the electrically insulating substrate, the silicon semiconductor layer comprising the channel region and the doped source and drain regions, the semiconductor layer further including first and second doped regions positioned respectively between the channel region and the doped source and drain regions, the first and second doped regions, the channel region and the doped source and drain regions having n-type doping levels, the n-type doping level of the first and second doped regions being greater than the n-type doping level of the channel region and less than the n-type doping level of the doped source and drain regions, the first dielectric layer overlapping the first and second doped regions.

20. A field-effect floating gate memory device comprising:
a channel region having a conductivity type and adjoining an electrically insulating substrate;
doped source and drain regions operatively associated with and having the same conductivity type as the channel region;
a control gate;
a floating gate for storing carriers from the channel region, the floating gate being positioned between the channel region and the control gate, the floating gate having a doping type opposite to the conductivity type of the channel region;
a first, high-k dielectric layer thinner than five nanometers between the channel region and the floating gate and positioned to facilitate the direct tunneling of majority carriers from the channel region into the floating gate, the first, high-k dielectric layer being configured to provide a lower barrier for the tunneling of majority carriers from the channel region into the floating gate compared to that for minority carriers in the channel region, and
a second dielectric layer between the control gate and the floating gate,
wherein the first, high-k dielectric layer has a smaller effective tunneling mass for the majority carriers than for minority carriers.

21. A field-effect floating gate memory device comprising:
a channel region having a conductivity type and adjoining an electrically insulating substrate;
doped source and drain regions operatively associated with and having the same conductivity type as the channel region;

a control gate;

a floating gate for storing carriers from the channel region, the floating gate being positioned between the channel region and the control gate, the floating gate having a doping type opposite to the conductivity type of the channel region;

a first, high-k dielectric layer thinner than five nanometers between the channel region and the floating gate and positioned to facilitate the direct tunneling of majority carriers from the channel region into the floating gate, the first, high-k dielectric layer being configured to provide a lower barrier for the tunneling of majority carriers from the channel region into the floating gate compared to that for minority carriers in the channel region, and a second dielectric layer between the control gate and the floating gate, wherein the first, high-k dielectric layer has a lower conduction band-offset with the channel region than a valence band-offset with the channel region.

* * * * *